United States Patent
Hirao

(10) Patent No.: US 12,154,484 B2
(45) Date of Patent: Nov. 26, 2024

(54) LIGHT EMITTING DEVICE AND IMAGE DISPLAY DEVICE

(71) Applicant: SONY GROUP CORPORATION, Tokyo (JP)

(72) Inventor: Naoki Hirao, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 0 days.

(21) Appl. No.: 18/001,176

(22) PCT Filed: Jun. 8, 2021

(86) PCT No.: PCT/JP2021/021667
§ 371 (c)(1),
(2) Date: Dec. 8, 2022

(87) PCT Pub. No.: WO2021/256323
PCT Pub. Date: Dec. 23, 2021

(65) Prior Publication Data
US 2023/0230530 A1   Jul. 20, 2023

(30) Foreign Application Priority Data
Jun. 19, 2020   (JP) .................. 2020-106461

(51) Int. Cl.
*G09G 3/32* (2016.01)
(52) U.S. Cl.
CPC ......... *G09G 3/32* (2013.01); *G09G 2300/026* (2013.01); *G09G 2300/0439* (2013.01); *G09G 2320/0233* (2013.01)

(58) Field of Classification Search
CPC ..... G09G 2300/026; G09G 2300/0439; G09G 2320/0233; G09G 3/32; G09G 2300/0452;
(Continued)

(56) References Cited

U.S. PATENT DOCUMENTS

| 10,651,159 B2* | 5/2020 | Adema ................. G06F 3/1446 |
| 2008/0174515 A1* | 7/2008 | Matthies ............... H01L 25/167 |
| | | 345/1.3 |

(Continued)

FOREIGN PATENT DOCUMENTS

| JP | 2008-015540 A | 1/2008 |
| JP | 2010-282009 A | 12/2010 |

(Continued)

OTHER PUBLICATIONS

International Search Report and Written Opinion of PCT Application No. PCT/JP2021/021667, issued on Aug. 3, 2021, 09 pages of ISRWO.

*Primary Examiner* — Kenneth Bukowski
(74) *Attorney, Agent, or Firm* — CHIP LAW GROUP

(57) ABSTRACT

Provided is a light emitting device in which a joint between panels is made less visible without unduly compromising practicality. The light emitting device includes an array of a plurality of unit panels each having a surface region divided into a plurality of pixels. Each of the plurality of the unit panels includes a first pixel including at least one of pixels adjacent to an outer periphery of the unit panel, out of the plurality of the pixels, and a second pixel including at least one pixel other than the first pixel. The number of light sources provided for the first pixel is greater than the number of light sources provided for the second pixel.

7 Claims, 7 Drawing Sheets

(58) Field of Classification Search
CPC ... G09G 2310/0232; G09G 2320/0242; G09G 2340/0407; G09F 9/302; G09F 9/33; G09F 9/40; H01L 33/00
See application file for complete search history.

(56) References Cited

U.S. PATENT DOCUMENTS

| | | | |
|---|---|---|---|
| 2015/0097837 A1* | 4/2015 | Jepsen | G06F 3/1446 345/428 |
| 2015/0138755 A1* | 5/2015 | Bastani | G02F 1/133602 362/97.1 |
| 2021/0020616 A1* | 1/2021 | Ray | H01L 25/0652 |

FOREIGN PATENT DOCUMENTS

| | | |
|---|---|---|
| JP | 2011-075825 A | 4/2011 |
| JP | 2019-075528 A | 5/2019 |
| WO | 2016/152321 A1 | 9/2016 |
| WO | 2019/067500 A1 | 4/2019 |

* cited by examiner

[FIG. 1]
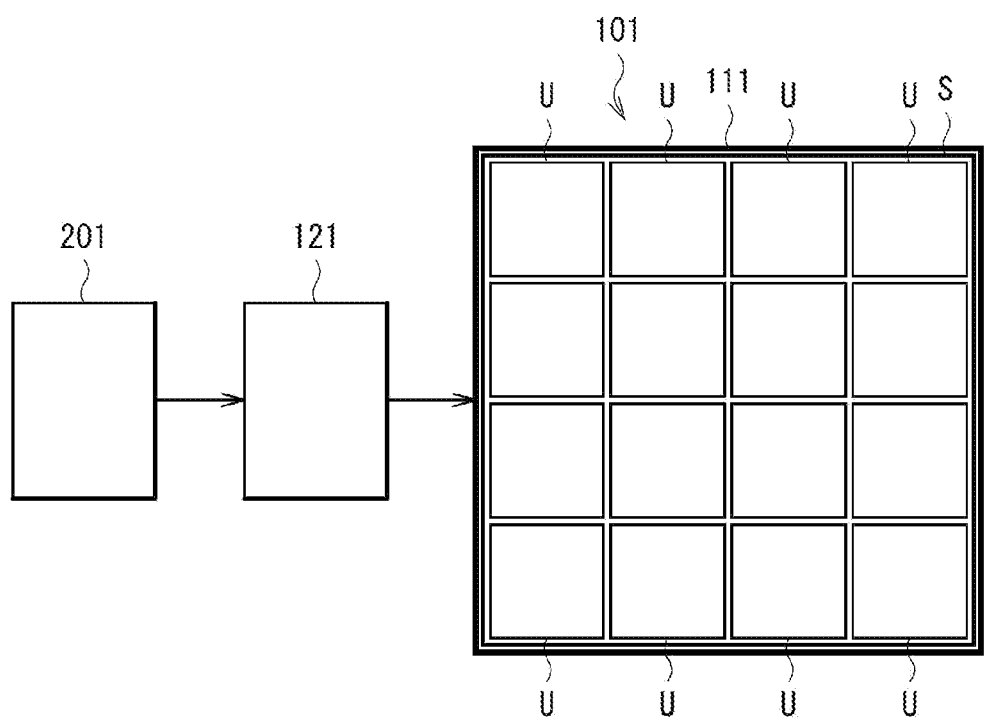

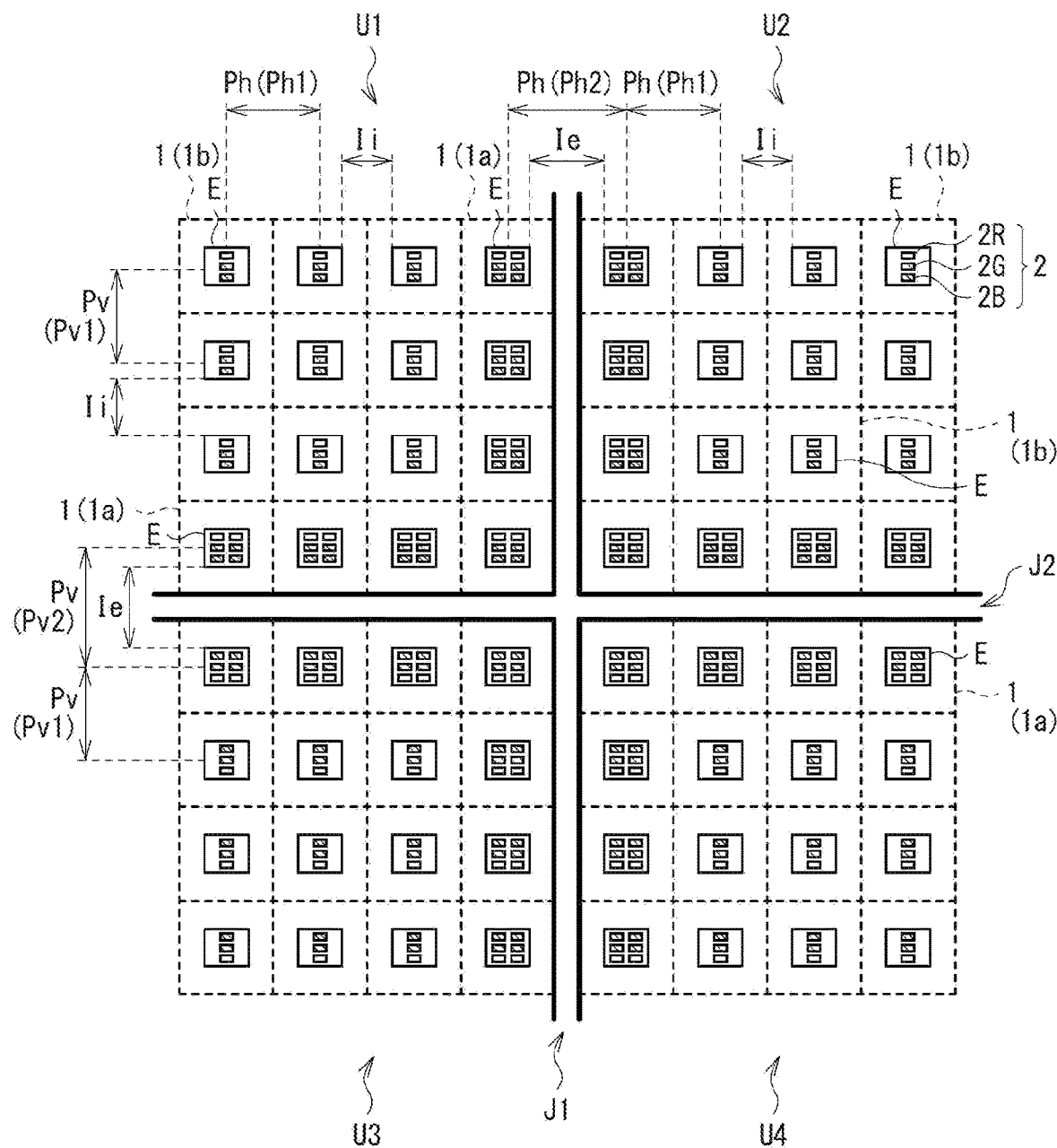
[FIG. 2]

[FIG. 3]
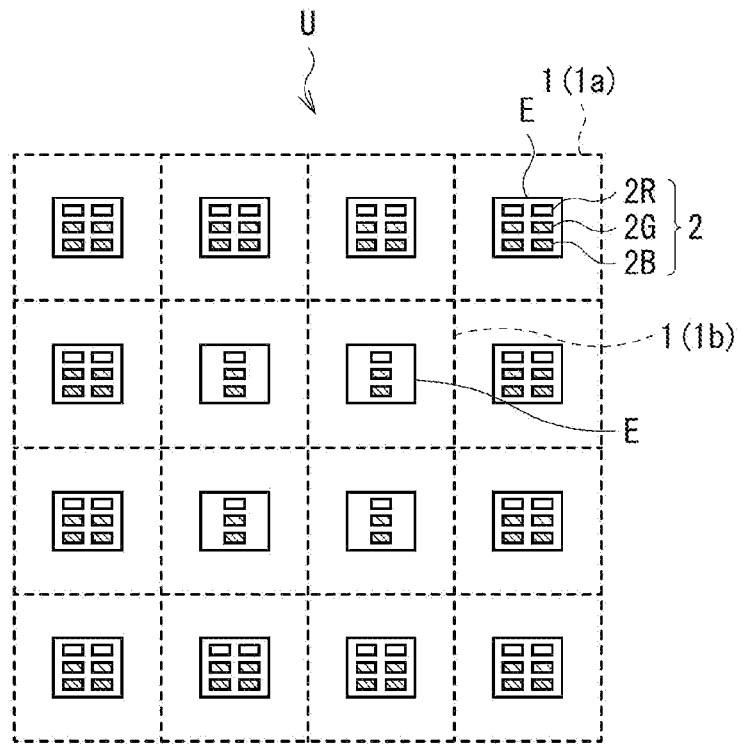
[FIG. 4]
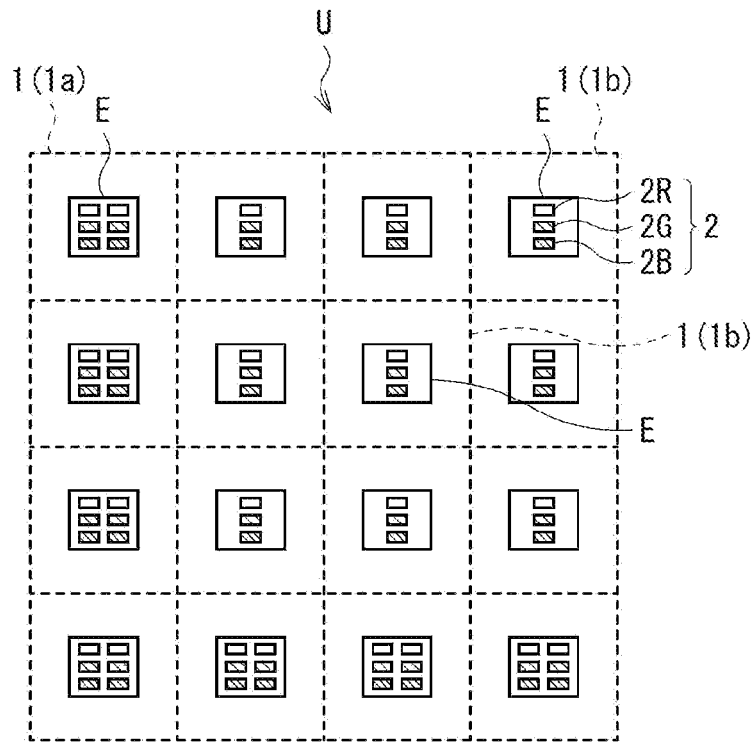

[FIG. 5]
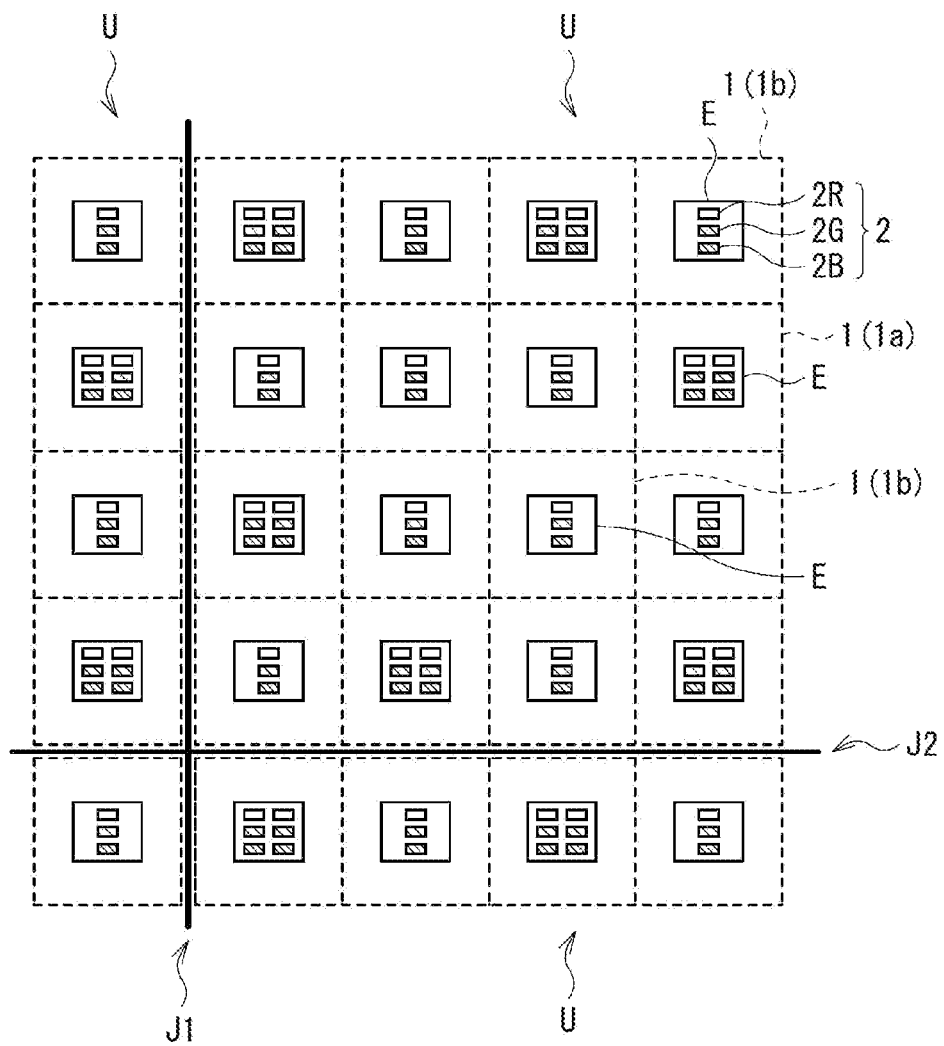

[FIG.6]
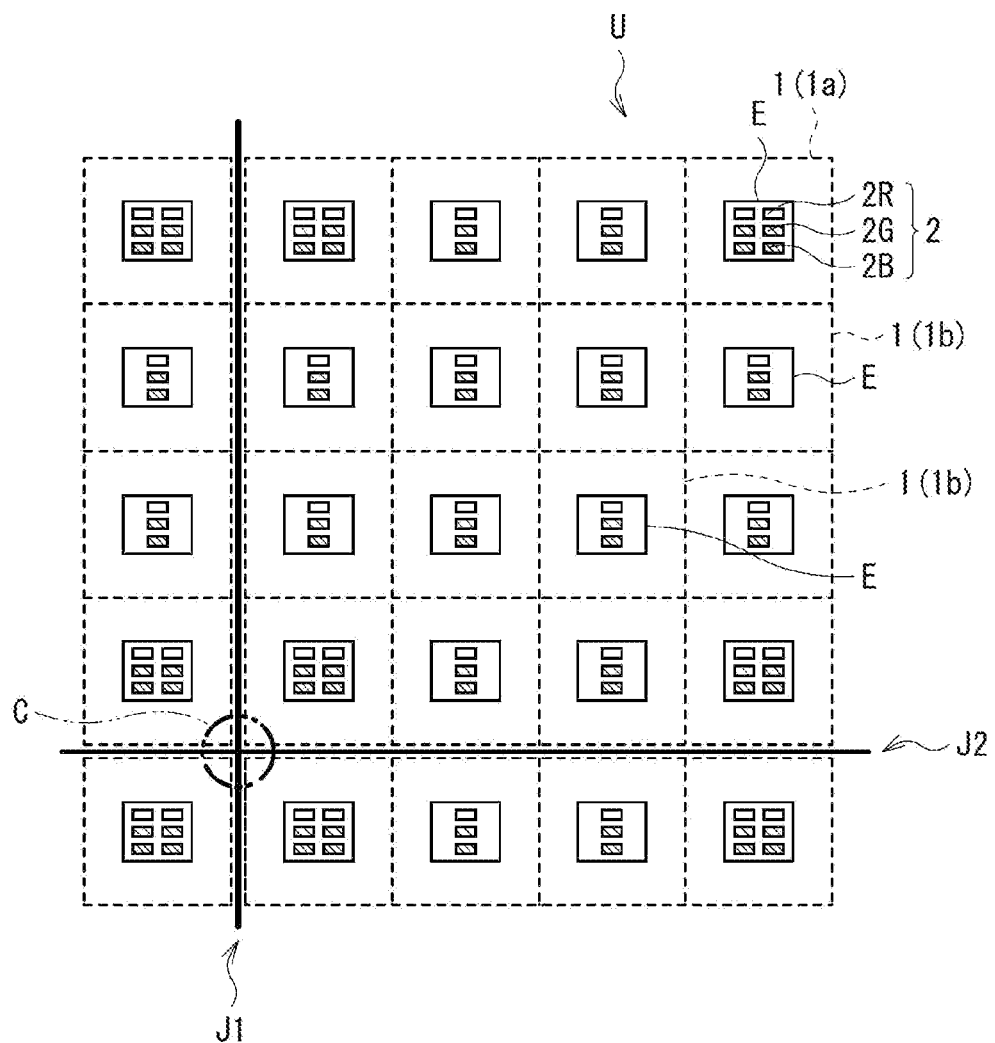

[FIG. 7]
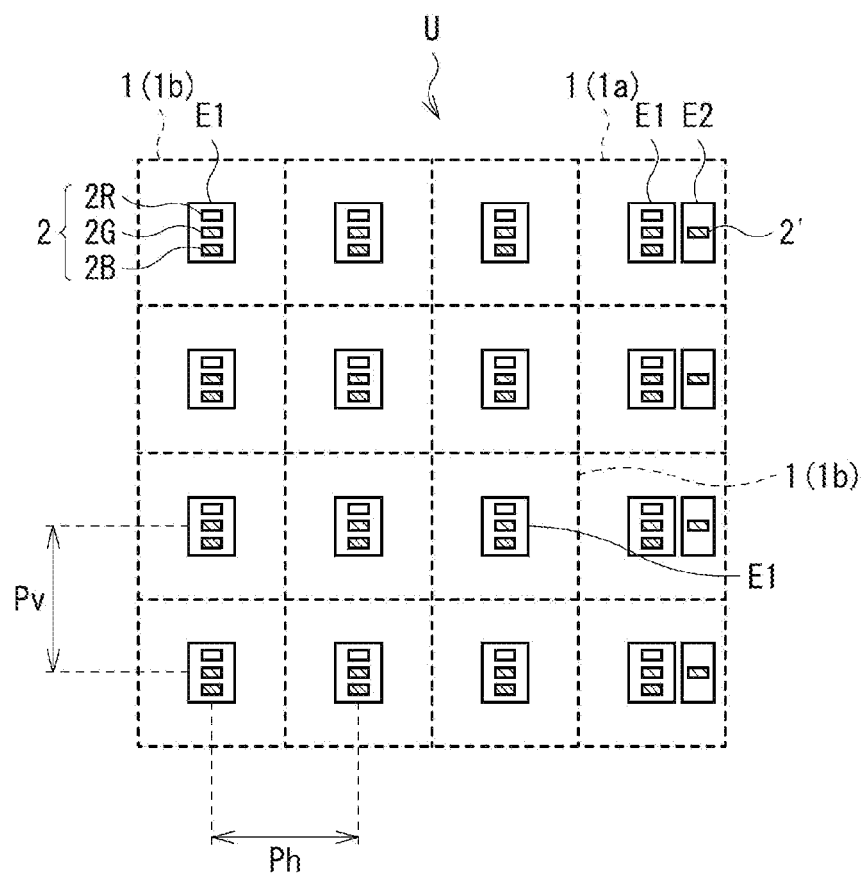

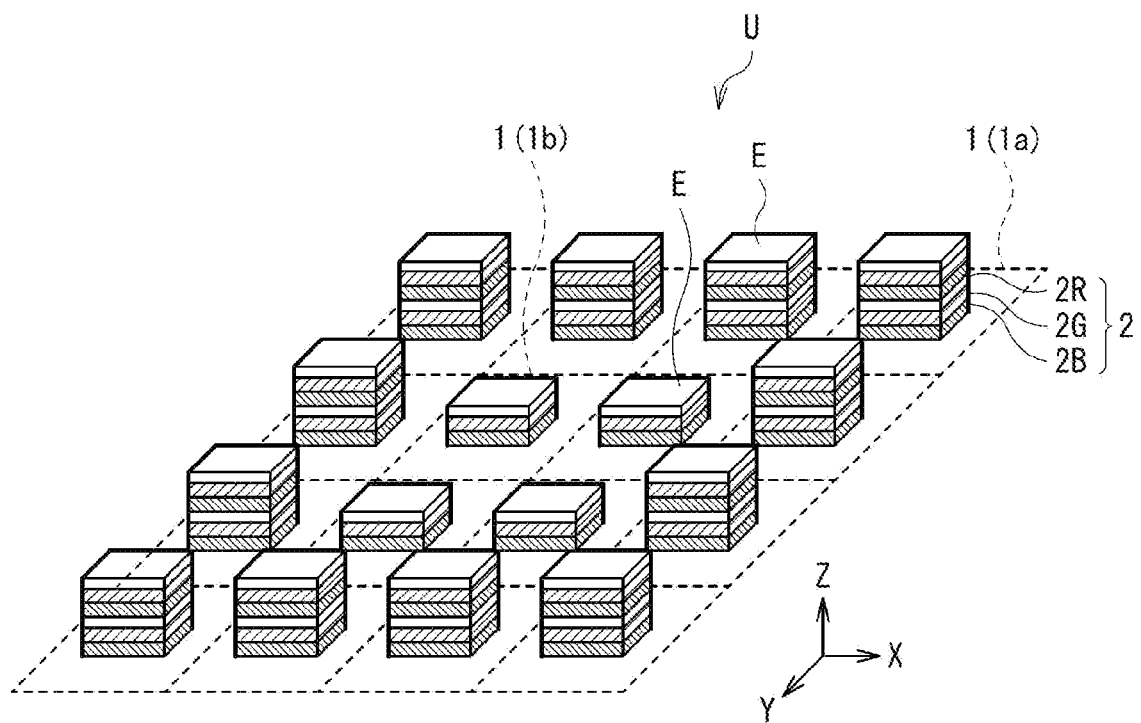
[FIG.8]

LIGHT EMITTING DEVICE AND IMAGE DISPLAY DEVICE

CROSS REFERENCE TO RELATED APPLICATIONS

This application is a U.S. National Phase of International Patent Application No. PCT/JP2021/021667 filed on Jun. 8, 2021, which claims priority benefit of Japanese Patent Application No. JP 2020-106461 filed in the Japan Patent Office on Jun. 19, 2020. Each of the above-referenced applications is hereby incorporated herein by reference in its entirety.

TECHNICAL FIELD

The present disclosure relates to a light emitting device and an image display device.

BACKGROUND ART

In tiling displays, a screen is formed by arranging unit panels in a vertical direction and a horizontal direction and combining them with one another (PTL 1). In tiling displays, generally, a surface region of a unit panel is divided into a plurality of pixels at an equal pitch to each other, and each of the plurality of the pixels is provided with the equal number of light sources.

CITATION LIST

Patent Literature

PTL 1: Japanese Unexamined Patent Application Publication No. 2011-075825

SUMMARY OF THE INVENTION

In tiling displays, because of variations in brightness of light sources and installation accuracy in arranging the unit panels, there is a case where borders formed between adjacent unit panels are visually recognized by a viewer as a joint between the panels. For this issue, it is possible to make the joint less visible by locally increasing or decreasing the brightness of the light sources close to the borders, or by improving installation accuracy of the unit panels. However, this method necessitates matching brightness of an entire display to minimum brightness of the light source to be adjusted, which is accompanied by a disadvantage of lowered brightness of the entire display. Thus, as actual operation, adjustment of the brightness is kept to a minimum while the installation accuracy of the unit panels is improved as much as possible. However, improving the installation accuracy has some practical concerns. For example, improving the installation accuracy involves a special instrument or mechanism such as a jig to realize this, or it takes a long time to do the work of arranging the unit panels.

The present disclosure is intended to provide a light emitting device and an image display device that make it possible to make a joint between panels less visible without unduly compromising practicality.

A light emitting device according to one embodiment of the present disclosure includes an array of a plurality of unit panels each having a surface region divided into a plurality of pixels. Each of the plurality of the unit panels includes: a first pixel including at least one of pixels adjacent to an outer periphery of the unit panel, out of the plurality of the pixels; and a second pixel including at least one pixel other than the first pixel. In the present embodiment, the number of light sources provided for the first pixel is greater than the number of light sources provided for the second pixel.

An image display device according to another embodiment of the present disclosure includes: a display unit including an array of a plurality of unit panels each having a surface region divided into a plurality of pixels; and a control unit configured to drive each of the plurality of the unit panels on the basis of image data. In the display unit, each of the plurality of the unit panels includes: a first pixel including at least one of pixels adjacent to an outer periphery of the unit panel, out of the plurality of the pixels; and a second pixel including at least one pixel other than the first pixel. The second pixel includes light sources of multiple colors. The first pixel includes light sources of the multiple colors and additional light sources, and includes more light sources than the second pixel.

BRIEF DESCRIPTION OF DRAWINGS

FIG. 1 is a schematic diagram illustrating an overall configuration of an image display device according to a first embodiment of the present disclosure.

FIG. 2 is an explanatory diagram schematically illustrating an array of unit panels in the image display device according to the embodiment mentioned above.

FIG. 3 is an explanatory diagram schematically illustrating an arrangement of light sources for each unit panel in the image display device according to the embodiment mentioned above.

FIG. 4 is an explanatory diagram schematically illustrating another example (first modification example) of the arrangement of the light sources for each unit panel in the image display device according to the embodiment mentioned above.

FIG. 5 is an explanatory diagram schematically illustrating still another example (second modification example) of the arrangement of the light sources for each unit panel in the image display device according to the embodiment mentioned above.

FIG. 6 is an explanatory diagram schematically illustrating still another example (third modification example) of the arrangement of the light sources for each unit panel in the image display device according to the embodiment mentioned above.

FIG. 7 is an explanatory diagram schematically illustrating an arrangement of light sources for each unit panel in an image display device according to a second embodiment of the present disclosure.

FIG. 8 is an explanatory diagram schematically illustrating an arrangement of light sources for each unit panel in an image display device according to a third embodiment of the present disclosure.

MODES FOR CARRYING OUT THE INVENTION

In the following, embodiments of the present disclosure are described in detail with reference to the accompanying drawings. Embodiments to be described below are specific examples of the present disclosure, and the technology related to the present disclosure is not limited to the following specific modes. Moreover, similarly, arrangements of constituent elements related to the present disclosure, dimensions of each constituent element, and dimension ratios between the constituent elements are not limited to examples illustrated in each figure.

Description is given in the following order.
1. First Embodiment
1.1. Overall Configuration of Image Display Device
1.2. Configuration of Display Unit of Image Display Device
1.2.1. Array of Unit Panels
1.2.2. Arrangement of Light Sources in Unit Panel (Pattern 1)
1.3. Workings and Effects
1.4. Description of Modification Examples
1.4.1. First Modification Example (Pattern 2)
1.4.2. Second Modification Example (Pattern 3)
1.4.3. Third Modification Example (Pattern 4)
2. Second Embodiment
3. Third Embodiment
4. Conclusion

1. FIRST EMBODIMENT

[1.1. Overall Configuration of Image Display Device]

FIG. 1 is a schematic diagram of an overall configuration of an image display device 101 according to a first embodiment of the present disclosure.

The image display device 101 includes a display unit 111 and a control unit 121.

The display unit 111 is a "display unit" of the image display device according to the present embodiment and constitutes a "light emitting device". The display unit 111 is constituted by arraying a plurality of unit panels U in a first direction (for example, a vertical direction or longitudinal direction) and in a second direction (for example, a horizontal direction or lateral direction) and combining them together. With the plurality of these unit panels U, it is possible to form one screen S as a whole. As described later, each of the unit panels U has a surface region divided into a plurality of pixels, and includes light sources for each pixel.

The control unit 121 is a "control unit" of the image display device according to the present embodiment, acquires image data, and generates a control signal to drive the display unit 111 on the basis of the image data. The control unit 121 may include a microcomputer including, for example, a central processing unit (CPU) including a processor, various memories such as a ROM and a RAM, and input and output interfaces. The control unit 121 has computer programs held in advance, operates in accordance with the programs, and generates the control signal for the display unit 111. In the present embodiment, the control unit 121 is configured to drive, for each pixel, each of the unit panels U included in the display unit 111.

The control unit 121 is coupled to an external device 201, and is configured to acquire the image data from the external device 201. The external device 201 applicable may be exemplified by a personal computer and an imaging device such as a video camera. Acquisition of the image data may be carried out by the external device 201, or through, for example, a recording medium coupled to the control unit 121 or a network line.

[1.2. Configuration of Display Unit of Image Display Device]

1.2.1. Array of Unit Panels

FIG. 2 is an explanatory diagram schematically illustrating an array of the unit panels U in the image display device 101 (display unit 111) according to the present embodiment.

The unit panels U are arrayed in the vertical direction and in the horizontal direction, and form the single screen S as a whole. For purposes of convenience, FIG. 2 illustrates solely four unit panels U1, U2, U3, and U4 in an array of two in the vertical direction and two in the horizontal direction, out of the plurality of the unit panels U that form the whole screen S. The number of the unit panels U arrayed in the formation of the single screen S may be selected as appropriate in accordance with a purpose of display.

Each of the unit panels U has the surface region divided into the plurality of the pixels 1, and includes the light sources 2 for each pixel 1. In the present embodiment, the surface region of the unit panel U is divided into the plurality of the pixels 1 arranged in the same directions as the array of the unit panels U, i.e., in the vertical direction and in the horizontal direction. The surface region of the unit panel U includes the light sources 2 (2R, 2G, and 2B) for each pixel 1. In the present embodiment, as the light sources 2 provided for each pixel 1, light sources of multiple colors for color display are provided. Specifically, a first light source 2R, a second light source 2G, and a third light source 2B are provided. The first light source 2R is configured to emit red light. The second light source 2G is configured to emit green light. The third light source 2B is configured to emit blue light. These light sources 2R, 2G, and 2B of the three colors may be formed as light emitting diode (LED) light sources and integrated in a single light emitting element E. In other words, in the present embodiment, the light sources 2R, 2G, and 2B of the multiple colors (basically, three colors) are included to form the single light emitting element E, and the single light emitting element E is provided for each pixel 1. The multiple colors for the color display are not limited to the three colors mentioned above.

In the present embodiment, for the purpose of making the border between the adjacent unit panels U, i.e., joints J1 and J2 between the panels U and U (hereinbelow, simply referred to as "joints"), visually inconspicuous to a viewer, the plurality of the pixels 1 for each unit panel U is divided into a first pixel 1a and a second pixel 1b. The first pixel 1a includes at least one of pixels adjacent to an outer periphery of the unit panel U. The second pixel 1b includes at least one pixel other than the first pixel 1a. Moreover, the first pixel 1a and the second pixel 1b differ in the number of the light sources 2 provided for each pixel 1. Specifically, the first pixel 1a includes a pixel adjacent to the outer periphery of the unit panel U, while the second pixel 1b includes a pixel other than the first pixel 1a, in particular, a pixel closer to a center of the unit panel U than the first pixel 1a. The number of the light sources 2 provided for the first pixel 1a is greater than the number of the light sources 2 provided for the second pixel 1b.

In the present embodiment, as described above, the second pixel 1b includes the light sources 2R, 2G, and 2B, one each for the three colors, i.e., red, green, and blue. The light sources 2R, 2G, and 2B of these three colors are integrated to constitute the single light emitting element E. The light sources 2R, 2G, and 2B provided in the second pixel 1b are light sources normally provided for the color display.

In contrast, in addition to the light sources 2R, 2G, and 2B of the three colors provided for the second pixel 1b, the first pixel 1a further includes the light sources 2R, 2G, and 2B of a set of the same colors (that is, the three colors). The six light sources 2R, 2G, and 2B in total of these three colors are integrated to constitute the single light emitting device E. The light sources 2R, 2G, and 2B of the three colors additionally provided for the first pixel 1a are light sources provided for the purpose of correction (i.e., the adjustment of the brightness) carried out to make the joints J1 and J2 less visible.

In the present embodiment, in the unit panel U, the plurality of the pixels 1 including the first pixel 1a and the second pixel 1b are arranged at a predetermined first pitch Pv (=Pv1) in the vertical direction (vertically on the paper surface in FIG. 2), and arranged at a predetermined second pitch Ph (=Ph1) in the horizontal direction (horizontally on the paper surface in FIG. 2). Here, the first pitch Pv and the second pitch Ph may take an equal value. That is, the following is the case.

Pv1=Ph1

Furthermore, in the present embodiment, in the unit panel U, the light emitting element E is arranged at the center of each of the pixels 1 (1a and 1b). Thus, the pitch of the light emitting elements E arranged in the unit panel U is equal to the pitch of the pixels 1. The pitch of the light emitting elements E is the first pitch Pv (=Pv1) in the vertical direction, and the second pitch Ph (=Ph1) in the horizontal direction. In other words, regardless of the first pixel 1a and the second pixel 1b, the plurality of the light sources 2R, 2G, and 2B constituting the single light emitting element E is housed in a region of the single pixel 1. The light emitting element E is preferably configured to occupy half area or less of the surface region for each pixel 1. The additional light sources 2 may be coupled in series or in parallel to the normal light sources 2 for the purpose of the color display.

Furthermore, in the single unit panel U, an interval Ii is formed between the light emitting elements E and E provided for respective ones of the vertically and horizontally adjacent pixels 1 and 1. Between the adjacent unit panels U and U, an interval Ie is formed between the light emitting elements E and E provided for respective ones of the adjacent pixels 1 and 1 with the joints J1 and J2 in between. Here, between the first pitch Pv (=Pv1) and the second pitch Ph (=Ph1) of the light emitting elements E and E provided for the single unit panel U, and the first pitch Pv (=Pv2) and the second pitch Ph (=Ph2) of the light emitting elements E and E provided the different unit panels U and U that are adjacent with the joints J1 and J2 in between, the following relation is preferably established. However, the relation between the first pitches Pv1 and Pv2, and the relation between the second pitches Ph1 and Ph2 depend on the installation accuracy in arraying the unit panels U, and their magnitude varies with the installation accuracy. For example, there is a case where the first pitch Pv2 of the light emitting elements E and E provided for the different unit panels U and U is greater than the first pitch Pv1 of the light emitting elements E and E provided for the single unit panel U. In this case, the interval Ie formed between the adjacent unit panels U and U may be greater than the interval Ii in the single unit panel U (Ii<Ie). In contrast, there is a case where the former first pitch Pv2 may be smaller than the latter first pitch Pv1. In this case, the interval Ie may be smaller than the interval Ii (Ii>Ie). It is also possible to make the intervals Ii and Ie closer to each other by, for example, improving the installation accuracy.

Pv1=Pv2

Ph1=Ph2

1.2.2. Arrangement of Light Sources in Unit Panel

FIG. 3 is an explanatory diagram schematically illustrating the arrangement of the light sources 2 for each unit panel U in the image display device 101 according to the present embodiment (pattern 1).

In each of the example illustrated in FIG. 3 and modification examples illustrated later in FIGS. 4 to 6, for purposes of convenience, the unit panel U has the surface region divided into 16 (=4×4) pixels 1 in total. The plurality of these pixels 1 includes the first pixel 1a and the second pixel 1b. The first pixel 1a includes pixels adjacent to the outer periphery of the unit panel U. The second pixel 1b includes pixels other than the first pixel 1a. Moreover, the second pixel 1b includes the light sources 2R, 2G, and 2B, one each for the three colors for the color display. The three light sources 2R, 2G, and 2B of these three colors are integrated to constitute the single light emitting element E. Meanwhile, in addition to the light sources 2R, 2G, and 2B of the three colors provided for the second pixel 1b, the first pixel 1a further includes the light source 2R, 2G, and 2B of the set of the same colors (i.e., three colors). The six light sources 2R, 2G, and 2B of these three colors are integrated to constitute the single light emitting element E. The examples illustrated in FIGS. 3 to 6 are common in terms of the forgoing, and differ in terms of the arrangement of the first pixel 1a and the second pixel 1b.

In the present embodiment, as illustrated in FIG. 3, the first pixel 1a includes all pixels adjacent to the outer periphery of the unit panel U. In other words, in a case with the unit panel U having a rectangular outer periphery, the first pixel 1a includes all pixels located on each of its four sides. The second pixel 1b includes a pixel closer to the center of the unit panel U than the first pixel 1a. In the example illustrated in FIG. 3, the second pixel 1b includes four pixels close to the center of the unit panel U, with its periphery surrounded by the first pixel 1a.

[1.3. Workings and Effects]

Tiling displays include an array of a plurality of unit panels. In tiling displays, because of variations in brightness of light sources and the installation accuracy in arraying the unit panels, there is a case where borders formed between adjacent unit panels are visually recognized by a viewer as a joint between the panels. For this issue, it is possible to make the joint less visible by locally increasing or decreasing the brightness of the light sources close to the borders, or by improving the installation accuracy of the unit panels. However, this case necessitates matching brightness of an entire display to minimum brightness of the light source to be adjusted, which is accompanied by a disadvantage of lowered brightness of the entire display. Thus, as actual operation, adjustment of the brightness is kept to a minimum while the installation accuracy of the unit panels is improved as much as possible. However, improving the installation accuracy has some practical concerns. For example, improving the installation accuracy involves a special instrument or mechanism such as a jig to realize this, or it takes a long time to do the work of arranging the unit panels.

In contrast, according to the present embodiment, the first pixel 1a includes at least one of the pixels adjacent to the outer periphery of the unit panel U. The first pixel 1a differs from the other second pixel 1b in the number of the light sources 2. Providing the first pixel 1a with more light sources 2 than the second pixel 1b makes it possible to enlarge the allowable range of the adjustment of the variations in the brightness of the border between the unit panels U, i.e., the joints J1 and J2 between the panels U and U. In other words, with the light sources 2 of the first pixel 1a, in particular, the additional light sources 2 provided for the first pixel 1a, it is possible to attain the adjustment of the brightness of the joints J1 and J2, while suppressing a decrease in the brightness of the whole screen S. This makes it possible to make the joints J1 and J2 visually inconspicuous even with relatively low installation accuracy without excessively depending on the improvement of the installation accuracy of the unit panels U. It is possible to make the joints J1 and J2 less visible without unduly compromising the practicality. The adjustment with the additional light sources 2 may be made in accordance with the increase in the widths of the joints J1 and j2. For example, in a case where the widths of the joints J1 and J2 are increased to extend the interval Ie, the brightness of the light sources 2 of the first pixel 1a is raised. In a case where the widths of the joints J1 and J2 are decreased to reduce the interval Ie, the brightness of the light sources 2 of the first pixel 1a is reduced.

Furthermore, regardless of the first pixel 1a and the second pixel 1b, the pitches Pv and Ph at which the pixels 1 are arranged are constant. This makes it possible to suppress the complexity of the wiring accompanying the addition of the light sources 2 in the first pixel 1a, and to display an image with less discomfort.

Moreover, the first pixel 1a includes all the pixels 1 adjacent to the outer periphery of the unit panel U. This makes it possible to increase an amount of the adjustment of the brightness of the joints J1 and J2, and to cope with the substantial adjustment of the brightness.

The arrangement of the light sources 2 according to the present embodiment is suitable for application to the unit panel U with the other unit panels U arrayed on its upper, lower, left, and right sides.

[1.4. Description of Modification Example]

1.4.1. First Modification Example

FIG. 4 is an explanatory diagram schematically illustrating another example (pattern 2) of the arrangement of the light sources 2 for each unit panel U in the image display device 101 according to the present embodiment.

In the first modification example, the first pixel 1a includes a pixel located solely on one side of a pair of opposite sides of the unit panel U. For example, in a case with the unit panel U having a rectangular shape, the first pixel 1a includes all the pixels located each of two sides that share one angle. In the example illustrated in FIG. 4, the first pixel 1a includes seven pixels located on each of a left side and a lower side. Meanwhile, the second pixel 1b includes all of nine pixels other than the first pixel 1a.

Thus, the first pixel 1a includes the pixels located solely on one side of the opposite sides of the unit panel U. This makes it possible to reduce, as appropriate, the number of the pixels provided as the first pixel 1a. Hence, it is possible to produce an appropriate effect while suppressing an increase in costs incurred by the increase in the number of the additional light sources 2.

The arrangement of the light sources 2 according to the present embodiment is suitable for application to the unit panel U located at four corners or angles of the screen S.

1.4.2. Second Modification Example

FIG. 5 is an explanatory diagram schematically illustrating still another example (pattern 3) of the arrangement of the light sources 2 for each unit panel U in the image display device 101 according to the present embodiment.

In the second modification example, the first pixel 1a includes pixels located on each of the pair of the opposite sides of the unit panel U. The first pixel 1a provided on one side of the pair of the sides and the first pixel 1a provided on another side are in displaced relation to each other in a parallel direction to each of the pair of the sides. For example, in the example in FIG. 5 with the unit panel U having the rectangular shape, the first pixel 1a is provided on a pair of an upper side and a lower side opposite to each other, and on a pair of a left side and a right side opposite to each other, out of four sides. Moreover, as for the former pair, the first pixel 1a located on the upper side and the first pixel 1a located on the lower side are in the displaced relation to each other in the parallel direction to each of the pair of the sides. As for the latter pair, the first pixel 1a located on the left side and the first pixel 1a located on the right side are in the displaced relation to each other in the parallel direction to each of the pair of the sides.

In the second modification example, the second pixel 1b mixedly includes a pixel adjacent to the outer periphery of the unit panel U and a pixel closer to the center of the unit panel U.

Furthermore, in the second modification example, in a case where the plurality of the unit panels U are arrayed to form the screen S, the first pixels 1a are in complementary relation to each other, between two sides adjacent to each other with the joints J1 and J2 in between, out of the adjacent unit panels U and U. In other words, the first pixels 1a are in the displaced relation to each other in the parallel direction to each of these two sides. For example, in the example in FIG. 5 with the unit panel U having the rectangular shape, the first pixel 1a located on the right side of one unit panel U of the adjacent unit panels U and the first pixel 1a located on the left side of the other unit panel U are in the displaced relation to each other in the vertical direction parallel to each of the two sides.

Thus, the first pixel 1a includes the pixels located on each of the pair of the opposite sides of the unit panel U. The first pixel 1a provided on one side of the pair of the sides and the first pixel 1a provided on the other side are in the displaced relation to each other in the parallel direction to each of the pair of the sides. This makes it possible to reduce, as appropriate, the number of the pixels provided as the first pixels 1a. Hence, it is possible to produce appropriate effects over the entire periphery of the unit panel U while suppressing the increase in the costs incurred by the increase in the number of the additional light sources 2.

Furthermore, the first pixels 1a are displaced from each other in the parallel direction to each of the two sides, between the two sides adjacent to each other with the joints J1 and J2 in between, out of the adjacent unit panels U and U. Thus, the first pixels 1a are brought into the complementary relation. This makes it possible to dispose the additional light sources 2 on both sides of the joints J1 and J2, specifically, on both left and right sides of the joint J1 extending vertically, and on both upper and lower sides of the joint J2 extending horizontally. Hence, it is possible to illuminate the joints J1 and J2 uniformly, to make the joints J1 and J2 less visible.

The arrangement of the light sources 2 according to the present embodiment is suitable for application to the unit panel U with the other unit panels U arrayed on its upper, lower, left, and right sides.

1.4.3. Third Modification Example

FIG. 6 is an explanatory diagram schematically illustrating still another example (pattern 4) of the arrangement of the light sources 2 for each unit panel 2 in the image display device 101 according to the present embodiment.

In the third modification example, the first pixel 1a includes pixels located diagonally on the outer periphery of the unit panel U. For example, in the case with the unit panel U having the rectangular shape, the first pixel 1a includes pixels located diagonally across a rectangle, i.e., pixels located at four corners. In the example illustrated in FIG. 6, the first pixel 1a includes four pixels located at respective four corners.

Thus, the first pixel 1a includes the pixels located diagonally on the outer periphery of the unit panel U. This makes it possible to attain local adjustment of the brightness, targeting a crossing part C of the joints J1 and J2. The crossing part C is one of locations to be most remarkably affected by the variations in the brightness. Hence, it is possible to alleviate the variations in the brightness while suppressing the number of the additional light sources 2 to a minimum. In particular, it is possible to make the joints J1 and J2 less visible around the crossing part C. In FIG. 6, the crossing part C is illustrated with emphasis by a bold dash-double dot line.

The arrangement of the light sources 2 according to the present embodiment is suitable for application to the unit panel U with the presence of the other unit panels U that share the crossing part C of the joints J1 and J2, e.g., the unit panel U with the other unit panels U arranged on its upper, lower, left, and right sides.

2. SECOND EMBODIMENT

In the forgoing description, in addition to the light sources 2R, 2G, and 2B of the three colors for the color display provided for the second pixel 1b, the first pixel 1a further includes the single set of the light sources 2R, 2G, and 2B of the same colors (i.e., the three colors). The six light sources 2R, 2G, and 2B in total of these three colors are integrated to constitute the single light emitting element E. However, the number and the colors of the additional light sources 2 provided for the first pixel 1a are not limited thereto, but may be selected as appropriate. For example, as the additional light sources 2, light sources of one color or two colors may be adopted out of the three colors for the color display. Alternatively, instead of providing one light source 2 for each color, two or more light sources 2 for each color may be provided. Moreover, the additional light sources 2 provided for the first pixel 1a may be constituted as a light emitting element separate from that for the color display.

As an example of such a case, FIG. 7 schematically illustrates the arrangement of the light sources 2 for each unit panel U in the image display device 101 according to the second embodiment of the present disclosure.

The image display device 101 according to the present embodiment has a similar configuration to as illustrated in FIG. 1. As with the forgoing first embodiment, the plurality of the unit panels U are arrayed and combined with one another to form the single screen S.

Each of the unit panels U has the surface region divided into the plurality of the pixels 1 at the predetermined pitches (the predetermined first pitch Pv in the vertical direction and the predetermined second pitch Ph in the horizontal direction). In each of the pixels 1, the first light emitting element E1 is disposed at the center of the pixel 1. In the first light emitting element E1, integrated is the plurality of the light sources 2 for the color display, i.e., the light sources 2R, 2G, and 2B respectively configured to emit red, green, and blue light. Here, in the unit panel U, the first light emitting elements E1 are arranged at the first pitch Pv in the vertical direction and arranged at the second pitch Ph in the horizontal direction. The first light emitting element E1 is provided for each pixel 1. The first pitch Pv and the second pitch Ph may take an equal value to each other. The light sources 2 (2R, 2G, and 2B) provided for the first light emitting element E1 correspond to "first light sources", according to the present embodiment.

In the present embodiment, in addition to the first light emitting element E1, the first pixel 1a includes an additional light source 2'. The first pixel 1a includes at least one of the pixels adjacent to the outer periphery of the unit panel U. The additional light source 2' is provided for the purpose of making the joints J1 and j2 less visible. The additional light source 2' corresponds to a "second light source" according to the present embodiment. In the example illustrated in FIG. 7, the unit panel U has the rectangular shape, and the first pixel 1a includes all the pixels located on the right side, out of the pixels adjacent to the outer periphery of the unit panel U.

As mentioned above, the additional light source 2' may be incorporated in the first light emitting element E1 and be unitarily constituted with the light sources 2R, 2G, and 2B. However, in the present embodiment, the additional light source 2' is constituted as a second light emitting element E2 separate from the first light emitting element E1. Furthermore, as the additional light source 2', light sources of any one or two colors out of the three colors for the color display may be adopted. In the present embodiment, a green light source is adopted. Thus, apparently, in the unit panel U, the first light emitting elements E1 are arrayed at the predetermined pitches Pv and Ph, while one or more light sources 2' for correction are located along the outer periphery of the unit panel U, without keeping to the predetermined pitches. In the first light emitting element E1, the plurality of the light sources 2 (2R, 2G, and 2B) for the color display are integrated.

As with what has already been described, the area occupied by the first light emitting element E1 and the second light emitting element E2 is half or less of the area of the surface region of the first pixel 1a. The first light emitting element E1 and the second light emitting element E2 are housed in the region of the first pixel 1a.

3. THIRD EMBODIMENT

In the forgoing description, in each of the first pixel 1a and the second pixel 1b, the plurality of the light sources 2R, 2G, and 2B are arranged in parallel directions to the surface region of the unit panel U, i.e., in plane directions X and Y of the pixels 1a and 1b. However, the directions of the arrangement of the light sources are not limited thereto. For example, a direction perpendicular to the surface region of the unit panel U may be adopted. That is, the plurality of the light sources 2R, 2G, and 2B are disposed in a stack in a direction Z perpendicular to the plane directions X and Y of the pixels 1a and 1b.

As an example of such a case, FIG. 8 schematically illustrates the arrangement of the light sources 2 for each unit panel U in the image display device 101 according to a third embodiment of the present disclosure.

In the present embodiment, in each of the first pixel 1a and the second pixel 1b, the light sources 2R, 2G, and 2B are disposed in the stack in the direction Z perpendicular to the plane directions X and Y of the pixels 1a and 1b. The first pixel 1a includes the pixels adjacent to the outer periphery of the unit panel U. The second pixel 1b includes the pixels other than the first pixel 1a. The second pixel 1b includes the plurality of the light sources 2R, 2G, and 2B (for example, of the three colors) for the color display. These three light sources of the three colors are put together into a set to constitute the single light emitting element E. Meanwhile, in addition to the set of the light sources 2R, 2G, and 2B provided for the second pixel 1b, the first pixel 1a further includes the set of the light sources 2R, 2G, and 2B of the same colors. These six light sources of the three colors are put together into a set to constitute the single light emitting element E. The additional light sources are not limited thereto, but may include light sources of any one or two of the three colors for the color display. The arrangement of the first pixels 1a and the second pixels 1b in the unit panel U may be similar to the examples illustrated in FIGS. 3 to 6, may be similar to the example illustrated in FIG. 7, or may be other arrangements.

As with the first embodiment as described above, the plurality of the unit panels U are arrayed and combined with one another to constitute the single screen S. Furthermore, the area occupied by the light emitting element E is half or less of the area of the surface region of the pixel 1a or 1b. The light emitting element E is housed in the region of each of the first pixel 1a and the second pixel 1b.

As a modification example of the arrangement of the light sources according to the present embodiment, the directions of the arrangement of the normal light sources 2R, 2G, and 2B for the color display may be the plane directions X and Y of the pixels 1a and 1b, while the direction of the arrangement of the additional light sources 2R, 2G, and 2B for the correction with respect to the normal light sources may be the direction Z perpendicular to the plane directions X and Y of the pixels 1a and 1b.

In the forgoing description, there is no particular reference to the sizes of the normal light sources for the color display and the additional light sources for the correction. The light sources for the correction may include light sources of different sizes from the light sources for the color display. The light sources for the correction may include light sources of smaller sizes from the light sources for the color display.

4. CONCLUSION

As described, the embodiments of the present disclosure are described in detail with reference to the drawings. According to the embodiments of the present disclosure, it is possible to attain balance between ensuring practicality and enhancing functionality by making the joints J1 and J2 less visible.

The technology of the present disclosure is not limited to the forgoing specific modes. Various modification may be made, and combinations of the modification examples may be made.

Furthermore, not all of the configurations and the operation described in each embodiment are essential to the configurations and the operation of the present disclosure. For example, among constituent elements in each embodiment, constituent elements not described in the independent claims indicating the most significant concepts of the present disclosure are to be understood as optional constituent elements.

Terms used throughout this specification and the appended claims should be construed as "non-limiting" terms. For example, the terms "include" or "included" should be construed as "not limited to a mode described as included". The term "have" should be construed as "not limited to a mode described as having".

Some of the terms used herein are used merely for convenience of description and are not intended to limit configurations and operation, etc. For example, the terms such as "right", "left", "upper", and "lower" indicate only the directions on the figure to be referred to. Furthermore, the terms such as "inner" and "outer" refer respectively to a direction toward the center of the element of interest and a direction away from the center of the element of interest. The same applies to terms similar to or synonymous with these terms.

The technology of the present disclosure may also have the following configurations. According to the technology of the present disclosure having the following configurations, it is possible to attain balance between ensuring practicality and enhancing functionality by making the joints J1 and J2 less visible. Effects to be produced by the technology of the present disclosure are not limited thereto, but may include any effect described herein.

(1)

A light emitting device including an array of a plurality of unit panels each having a surface region divided into a plurality of pixels, each of the plurality of the unit panels including: a first pixel including at least one of pixels adjacent to an outer periphery of the unit panel, out of the plurality of the pixels; and a second pixel including at least one pixel other than the first pixel, in which the number of light sources provided for the first pixel is greater than the number of light sources provided for the second pixel.

(2)

The light emitting device according to (1), in which the second pixel includes a pixel closer to a center of the unit panel than the first pixel.

(3)

The light emitting device according to (1) or (2), in which the pixels are arranged at a predetermined first pitch in a first direction of the surface region and arranged at a predetermined second pitch in a second direction perpendicular to the first direction.

(4)

The light emitting device according to any one of (1) to (3), in which the first pixel includes all pixels adjacent to the outer periphery of the unit panel.

(5)

The light emitting device according to any one of (1) to (3), in which the first pixel includes pixels located solely on one side of a pair of opposite sides of the unit panel.

(6)

The light emitting device according to any one of (1) to (3), in which the first pixel includes pixels located on each of a pair of opposite sides of the unit panel, and the first pixel provided on one side of the pair of the sides and the first pixel provided on another side are in displaced relation to each other in a parallel direction to each of the pair of the sides.

(7)

The light emitting device according to (6), in which between two sides of adjacent ones of the unit panels, the two sides being adjacent to each other with a border of the unit panels in between, the first pixels are in the displaced relation to each other in a parallel direction to each of the two sides.

(8)

The light emitting device according to any one of (1) to (3), in which the first pixel includes pixels located diagonally on the outer periphery of the unit panel.

(9)

The light emitting device according to any one of (1) to (8), in which the light sources comprise light emitting diodes.

(10)

An image display device including: a display unit including a light emitting device of any one of (1) to (9), the unit panel including light sources of multiple colors in each of the first pixel and the second pixel, and the first pixel including additional light sources; and a control unit configured to drive each of the plurality of the unit panels on the basis of image data.

(11)

The image display device according to (10), in which the first pixel includes, as the additional light sources, a light source of at least one color out of the multiple colors.

(12)

The image display device according to (10) or (11), in which the control unit is configured to drive the light sources for each of the pixels.

(13)

A light emitting device including an array of a plurality of unit panels each having a surface region divided into a plurality of pixels, each of the plurality of the unit panels including: first light sources arranged at a predetermined pitch and provided for each of the pixels; and second light sources provided for at least one of pixels adjacent to an outer periphery of the unit panel, out of the plurality of the pixels.

This application claims the benefit of Japanese Patent Application No. 2020-106461 filed with the Japan Patent Office on Jun. 19, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light emitting device, comprising:
  an array of a plurality of unit panels each having a surface region divided into a plurality of pixels, wherein each of the plurality of the unit panels comprises:
    a first pixel including at least one of pixels adjacent to an outer periphery of a unit panel of the plurality of unit panels, out of the plurality of pixels; and
    a second pixel including at least one pixel other than the first pixel, wherein
      number of light sources of the first pixel is greater than number of light sources of the second pixel,
      the first pixel comprises pixels located on each of a pair of opposite sides of the unit panel,
      the first pixel on one side of the pair of opposite sides and the first pixel on another side of the pair of opposite sides are in displaced relation to each other in a parallel direction to each of the pair of opposite sides, and
      between two sides of adjacent ones of the plurality of unit panels, the two sides being adjacent to each other with a border of the plurality of unit panels in between, the first pixel on one side of the two sides and the first pixel is on another side of the two sides are in the displaced relation to each other in a parallel direction to each of the two sides.

2. The light emitting device according to claim 1, wherein the second pixel comprises a pixel closer to a center of the unit panel than the first pixel.

3. The light emitting device according to claim 1, wherein the plurality of pixels are arranged at a first pitch in a first direction of the surface region and arranged at a second pitch in a second direction perpendicular to the first direction.

4. The light emitting device according to claim 1, wherein the light sources of the first pixel and the light sources of the second pixel comprise light emitting diodes.

5. An image display device, comprising:
  a display unit including an array of a plurality of unit panels each having a surface region divided into a plurality of pixels, wherein
    each of the plurality of the unit panels includes a first pixel and a second pixel,
    the first pixel includes at least one of pixels adjacent to an outer periphery of a unit panel of the plurality of unit panels, out of the plurality of pixels,
    the second pixel includes at least one pixel other than the first pixel,
    the second pixel includes light sources of multiple colors,
    the first pixel the including light sources of the multiple colors and additional light sources, and includes more light sources than the second pixel, wherein
    the first pixel comprises pixels located on each of a pair of opposite sides of the unit panel,
    the first pixel on one side of the pair of opposite sides and the first pixel on another side of the pair of opposite sides are in displaced relation to each other in a parallel direction to each of the pair of opposite sides, and
    between two sides of adjacent ones of the plurality of unit panels, the two sides being adjacent to each other with a border of the plurality of unit panels in between, the first pixel on one side of the two sides and the first pixel is on another side of the two sides are in the displaced relation to each other in a parallel direction to each of the two sides; and
  a control unit configured to drive each of the plurality of the unit panels based on image data.

6. The image display device according to claim 5, wherein the first pixel includes, as the additional light sources, a light source of at least one color out of the multiple colors.

7. The image display device according to claim 5, wherein the control unit is further configured to drive the light sources for each of the plurality of pixels.

* * * * *